United States Patent [19]

Butt

[11] Patent Number: 4,542,259
[45] Date of Patent: Sep. 17, 1985

[54] HIGH DENSITY PACKAGES

[75] Inventor: Sheldon H. Butt, Godfrey, Ill.

[73] Assignee: Olin Corporation, New Haven, Conn.

[21] Appl. No.: 651,985

[22] Filed: Sep. 19, 1984

[51] Int. Cl.$^4$ .............................................. H05K 5/06
[52] U.S. Cl. .................................. 174/52 FP; 29/588; 29/827
[58] Field of Search ............... 174/52 FP; 357/70, 74; 29/827, 588

[56] References Cited

U.S. PATENT DOCUMENTS

| | | |
|---|---|---|
| 3,341,369 | 9/1967 | Caule et al. |
| 3,391,456 | 7/1968 | Gannoe |
| 3,416,348 | 12/1968 | Carter, Jr. et al. ............. 174/52 FP |
| 3,475,227 | 10/1969 | Caule et al. |
| 3,676,292 | 7/1972 | Pryor et al. |
| 3,698,964 | 10/1972 | Caule et al. |
| 3,730,779 | 5/1973 | Caule et al. |
| 3,810,754 | 5/1974 | Ford et al. |
| 4,338,621 | 7/1982 | Braun ........................ 174/52 FP X |
| 4,410,927 | 10/1983 | Butt |
| 4,434,016 | 2/1984 | Saleh et al. |
| 4,463,217 | 7/1984 | Orcutt ............................ 174/52 FP |

FOREIGN PATENT DOCUMENTS 53-72456  6/1978  Japan ...................................... 357/70

OTHER PUBLICATIONS

Honn, *Eighty-Pin Package for Field-Effect Transistor Chips*, IBM Technical Disclosure Bulletin, vol. 15, No. 1, p. 308, Jun. 1972.

*Primary Examiner*—A. T. Grimley
*Assistant Examiner*—D. A. Tone
*Attorney, Agent, or Firm*—Howard M. Cohn; Barry L. Kelmachter; Paul Weinstein

[57] ABSTRACT

Several embodiments of high density packages which form an enclosure adapted to receive electronic devices are disclosed. Each package includes a metal lead frame having staggered leads which extend external to the package. A seal ring construction is provided so that hermetic seals are possible without subjecting the electronic devices to high temperatures. Various metals and sealing materials are advantageously used in the construction of the devices.

47 Claims, 8 Drawing Figures

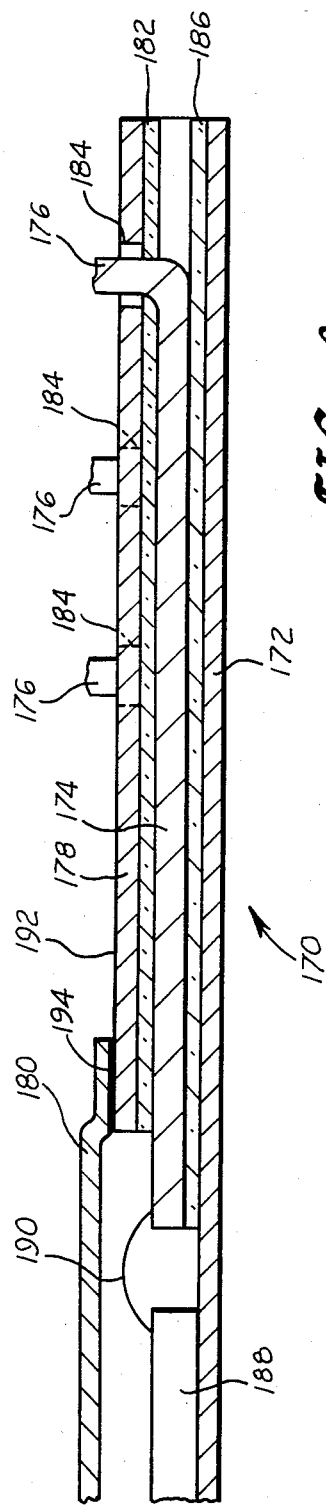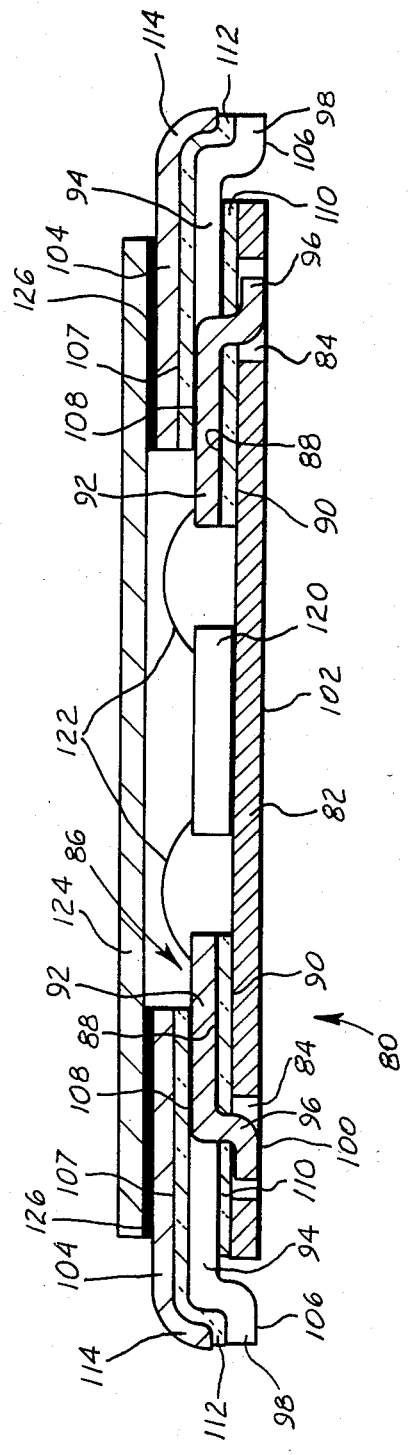

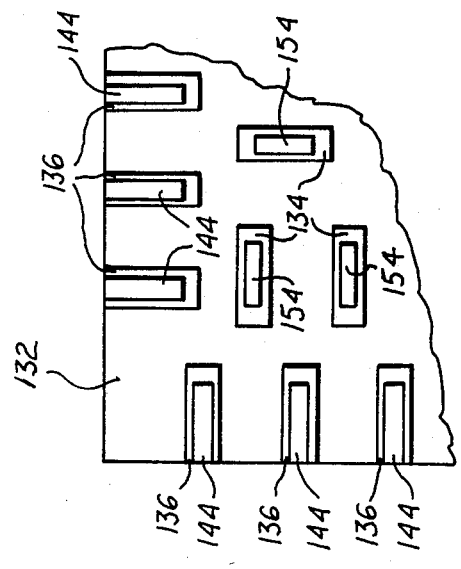
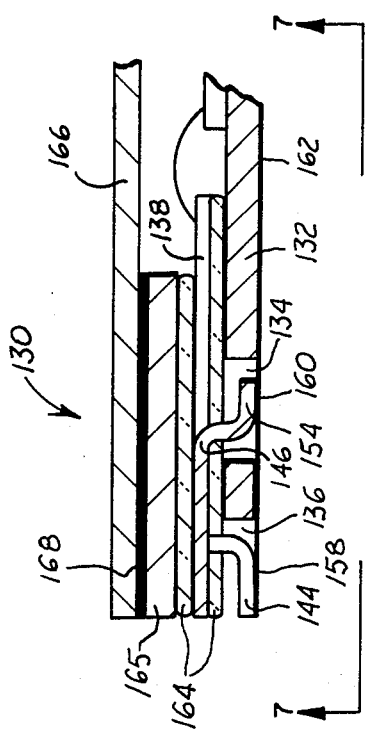
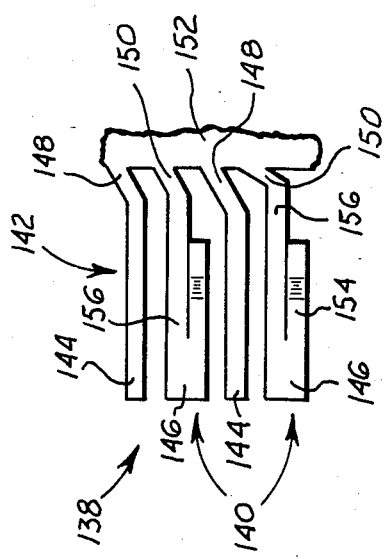

HIGH DENSITY PACKAGES

The present invention relates to U.S. patent application Ser. Nos. 341,392 entitled "Semiconductor Casing" by S. H. Butt, filed Jan. 21, 1982 now U.S. Pat. No. 4,461,924; 369,699 entitled "Improved Printed Circuit Board" by S. H. Butt, filed Apr. 19, 1982 now U.S. Pat. No. 4,491,622; 390,081 entitled "Improved Semiconductor Package" by S. H. Butt, filed June 21, 1982 now abandoned; 390,095 entitled "Semiconductor Casing" by S. H. Butt, filed June 21, 1982, now U.S. Pat. No. 4,410,927; 398,497 entitled "An Improved Semiconductor Casing" by S. H. Butt, filed July 15, 1982 now U.S. Pat. No. 4,480,262; 413,046 entitled "Multi-Layer Circuitry" by S. H. Butt, filed Aug. 30, 1982; 454,409 entitled "Semiconductor Packages", by S. H. Butt, filed Dec. 29, 1982; 477,552 entitled "Reinforced Glass Composites" by S. H. Butt, filed Mar. 21, 1983; 517,592 entitled "Clad Metal Lead Frame Substrates" by S. H. Butt, filed July 27, 1983; 539,449 entitled "Low Thermal Expansivity And High Thermal Conductivity Substrate" by S. H. Butt, filed Oct. 6, 1983; 587,411 entitled "Tape Packages" by S. H. Butt, filed Mar. 8, 1984; 587,433 entitled "Tape Bonding Material And Structure For Electronic Circuit Fabrication" by S. H. Butt, filed Mar. 8, 1984; and 598,112 entitled "Hermetically Sealed Metal Package" by S. H. Butt, filed Apr. 9, 1984.

While the invention is subject to a wide range of applications, it is especially suited for high density electronic package configurations and will be particularly described in that connection.

Microminiaturized electronic devices, such as semiconductor devices, are usually packaged in a lead frame structure to permit interconnection with an electronic system. Frequently, the lead frame structures are connected to a printed circuit board, which in turn, is adapted to be connected to an electronic system.

Typically, a semiconductor device, such as an intergrated circuit, includes a plurality of circuit elements. Various of these circuit elements may be electrically connected to the coplanar terminal portions of a miniaturized lead frame structure. The terminal portions are an integral part of the lead members extending from opposed portions of the lead frame. The terminal portions of the lead frame structure and the semiconductor device may be protected by the provision of a suitable casing formed from a ceramic or a metal or alternatively encapsulated by an electrical insulation material. This arrangement is conventionally referred to as a flat pack. The structures are often modified by bending the lead members at right angles to form two rows of parallel aligned lead members. This configuration is conventionally referred to as a Dual-In-Line package. The lead members are then adapted for insertion into female receptacles in a printed circuit board.

For through-hole insertion in printed circuit boards, it is normal to space the pins of Dual-In-Line packages (DIP) 0.10 inches apart. As the pin count increases, the packages naturally become quite long. For example, the standard length of a forty lead package is currently about 2.05 inches. Not only do these packages use up considerable surface area on the printed circuit board but the internal leads feeding to the end pins on the package are substantially longer than those leads feeding the center pins. This difference in length creates problems in high speed devices because of the difference in signal propagation time along leads of dissimilar lengths.

The prior art does teach providing multiple segment arrays such as disclosed in U.S. Pat. No. 3,391,456 to Gannoe where there is disclosed, for example, "a method for fabricating an array of closely spaced thin metallic segments". However, this patent does not deal with the problem of having the leads of the different lengths.

It is a problem underlying the present invention to provide a high density package forming an enclosure for an electronic device wherein the difference in signal propagation along the leads is minimized.

It is an advantage of the present invention to provide a high density package forming an enclosure for an electronic device which obviates one or more of the limitations and disadvantages of the described prior arrangements.

It is a yet further advantage of the present invention to provide a high density package forming an enclosure for an electronic device wherein the differential in internal lead length is significantly reduced.

It is a still further advantage of the present invention to provide a high density package forming an enclosure for an electronic device which is relatively inexpensive to manufacture.

It is a yet further advantage of the present invention to provide a high density package forming an enclosure for an electronic device of reduced size.

Accordingly, there has been provided a high density package forming an enclosure for receiving electronic devices. A metal lead frame having at least two staggered rows of leads is incorporated into a seal ring type package wherein the components are formed of metal. At least one row of leads on either side of the lead frame project through openings in the base member external to the package.

The invention and further developments of the invention are now elucidated by means of the preferred embodiments in the drawings.

FIG. 4 is a cross-sectional view of a small outline integrated circuit package having a lead frame and seal ring in accordance with the present invention.

FIG. 5 is a partial section of an alternative type of the small outline integrated circuit package.

FIG. 6 is a detailed view of a portion of the lead frame illustrated in FIG. 5.

FIG. 7 is a partial bottom view taken along line 7—7 of FIG. 5.

FIG. 8 is a section view of a pin grid array in accordance with the present invention.

Figure 1:
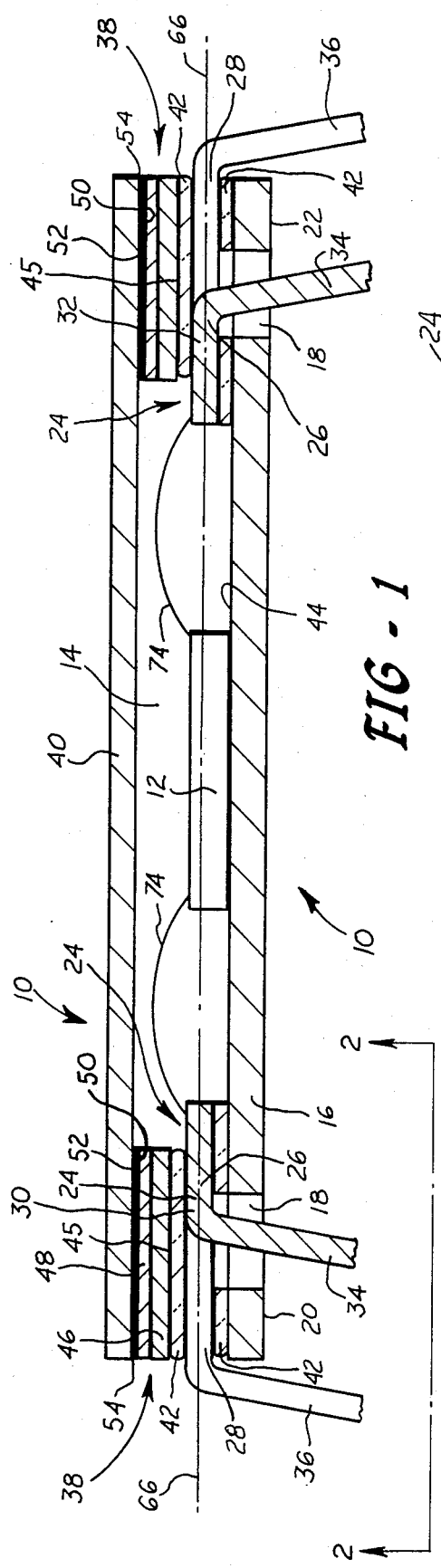
FIG. 1 is a cross-sectional view through a semiconductor package incorporating a lead frame in accordance with the present invention.

A hermetically sealed high density Quad-In-Line type semiconductor package or casing 10 is illustrated in FIG. 1. The casing is adapted to seal an electronic device such as an integrated circuit component 12 within an enclosure 14. The casing includes a metal or metal alloy base member 16 having a plurality of openings 18 extending therethrough and being substantially disposed in a row adjacent at least two opposing sides 20 and 22 thereof. A metal or metal alloy lead frame 24 is disposed adjacent the base member 16. The lead frame has first and second rows of leads 26 and 28, preferably staggered from each other and extending from at least two opposite sides 30 and 32, respectively thereof. Each of the first and second rows 26 and 28 have a plurality of leads 34 and 36, respectively. A metal or metal alloy seal ring member 38 is disposed adjacent the lead frame in opposing relationship to the base member 16. The plurality of leads 34 in the first row 26 each extend through one of the plurality of openings 18 in the base member external to the casing 10. Each of the plurality of leads 36 in the second row 28 extend between the base member 16 and seal ring member 38 external to the package. A metal or metal alloy cover member 40 is disposed adjacent the seal ring member. A sealing component 42 seals the enclosure. The sealing component is disposed between the base member and the lead frame, between the lead frame and the seal ring member and between the seal ring member and the cover member.

The present invention is particularly directed to the unique lead frame configuration including openings 18 through the base member 16. As mentioned hereinabove, it is desirable to decrease the length of the leads in high density packages where a large number of leads are required. The standard length of a forty lead package is about 2.050 inches. These packages use considerable surface area on the printed circuit board and the internal leads feeding to the end pins on the package are substantially longer than those feeding out to the center pins. This creates problems in high speed devices because of the difference in signal propagation time along leads of dissimilar lengths.

In FIG. 1, two staggered rows 26, 28 of leads 34, 36 are provided on either side 20, 22 of the package 10. The length of a forty-two lead package of this configuration is only about 1.150 inches as compared with a standard high pin count Dual-In-Line (DIP), a reduction of about 44%. Since the width of the package illustrated in FIG. 1 is the same as the standard DIP package, the surface area required on the printed circuit board is also reduced by 44%. The differential in internal lead length from the longest to the shortest leads is similarly reduced. It should also be noted that by passing the inner row of leads 26 through a hole 18 pierced in the base 16 (see FIG. 1), it is possible to fully support both rows 26 and 28 of leads without the necessity for cantilevering them external to the casing. Cantilever leads, which are generally weaker and more likely to be bent, would be necessary if the base could not be conveniently pierced with holes as is generally the case in a ceramic package.

The metal or metal alloy base member 16 preferably consists essentially of a high thermal conductivity metal or metal alloy such as for example, copper or aluminum metals or alloys. To provide improved glass bonding strength, the high conductivity metal or metal alloy base member are preferably limited to metallic materials which bond strongly to a glass bonding component. An alternative embodiment is a cladding of high thermal conductivity metal or metal alloy with a comparatively thinner layer of desired metal or metal alloy which bonds strongly with a glass bonding component. The preferred metal or metal alloy of the present invention which forms strong bonds with a glass bonding component may have a thin substantially continuous refractory oxide layer formed on its surface. The preferred alloy is a copper base alloy containing an effective amount of up to about 12% aluminum for forming a refractory oxide and the balance essentially copper. A more preferred alloy has from 2 to 12% aluminum and the balance copper. The alloy may also be constituted of 2 to 10% aluminum, 0.001 to 3% silicon and, if desired, a grain refining element selected from the group consisting of iron up to 4.5%, chromium up to 1%, zirconium up to 0.5%, cobalt up to 1% and mixtures of these grain refining elements and the balance copper. In particular, alloy C6381 containing 2.5 to 3.1% aluminum, 1.5 to 2.1% silicon and the balance copper is useful as a base component 16. Also, CDA alloy C63800, as disclosed in U.S. Pat. No. 3,676,292 to Pryor et al. is a suitable alloy. Alloy C63800 is similar to C6381 except that the former has an addition of cobalt. Impurities may be present in either alloy which do not prevent bonding in the desired embodiment.

A metal alloy component formed of a CDA alloy C63800 as described in U.S. Pat. Nos. 3,341,369 and 3,475,227 to Caule et al. have a refractory oxide layer formed on one or more of its surfaces. The oxide layer may include complex oxides formed with elements such as alumina, silica, tin, iron chromia, zinc, and manganese. Most preferably, the refractory oxide layer is substantially aluminum oxide ($Al_2O_3$). The refractory oxide may be formed on the substrate or component in any desired manner. For example, a copper base alloy such as alloy C63800 may be preoxidized in gases having an extremely low oxygen content. The C63800 may be placed in a container with 4% hydrogen, 96% nitrogen and a trace of oxygen released from a trace of water mixed in the gas. This gas may be heated to a temperature of between about 330° C. and about 820° C. Depending on the temperature and amount of time the alloy is left in the heated gas, a refractory oxide layer of a desired thickness forms on the surface of the alloy.

The present invention is not restricted to applications of alloy C63800 but includes the broad field of metal or metal alloys which have the ability to form continuous refractory oxide layers on their surface. Several examples of other metal alloys such as nickel base and iron base alloys are disclosed in U.S. Pat. Nos. 3,698,964, 3,730,779 and 3,810,754. The base member 16 preferably has a refractory oxide layer formed on at least portions of surface 44. However, it is within the scope of the invention to form the refractory oxide layer on all of the exposed surfaces of the base member 16.

The seal ring member 38 is also constructed of a metal or metal alloy as described above which forms strong bonds to a glass or ceramic sealing component. Preferably, the seal ring is formed of a C63800 type alloy and has a refractory oxide layer on at least its surface in contact with the glass or ceramic; however, it is also within the scope of the present invention to form the refractory oxide layer on the entire outer surface of the seal ring member. Although the seal ring member has been described as being a single alloy having a refractory oxide layer on its surface, it is also within the scope of the present invention to construct the seal ring member from a cladding wherein one layer 46 is a metal or metal alloy having the ability to form a continuous refractory oxide layer on its surface 45. As described hereinabove, the other layer 48 is a high conductivity readily solderable metal or alloy having a solerable surface 50. Preferably, layer 48 would be formed of a copper or copper alloy, such as CDA alloy C15100.

The cover member 40 is also fabricated from a suitably high conductivity, solderable metal or metal alloy having a solderable surface 52. Preferably it is selected from a copper or aluminum metal or alloy such as copper CDA alloy C15100. However, it is within the scope of the present invention to use any solderable metal or metal alloy to form the cover member 40 and the cladding layer 48. The advantage of having opposing, readily solderable surfaces 50 and 52 of the seal ring and cover member respectively, is the ability to solder components 38 and 40 together with less expensive solders than often required in the prior art.

The sealing component 54, which seals the cover member 40 onto the seal ring member 38, may be a conventional solder in accordance with the requirements of the specific application. For example, if there is a requirement to avoid flux, a gold-tin solder mixture might be desirable. Also, if there is a low temperature restraint, a lead-tin solder might be desirable. Further, it may be desirable to bond the cover member to the seal ring member with a different type of sealing component such as a sealing glass as described hereinbelow.

The present invention preferably uses any suitable solder glass or ceramic sealing component 42 having a coefficient of thermal expansion which closely matches the metal components. The glass or ceramic may be bonded to the thin refractory oxide surface layers (not shown) on both base member 16 and lead frame 24 so as to adhere these components together and electrically insulate them from each other. When the glass or ceramic sealing component and the copper alloy members have the same or closely matched coefficients of thermal expansion, thermal stresses in the system and the problems associated therewith may be essentially eliminated from the finished product. Glass or ceramic with mismatched coefficients of thermal expansion may be used because the specific character of the refractory oxide layer on the preferred alloys allows bonding to solder glasses with significantly lower coefficients of thermal expansion than that of the alloy. It has been demonstrated that mechanically sound bonds can be achieved between C63800 and CV432 (contraction coefficient of $127 \times 10^{-7}$° C.).

Table I lists various exemplary solder glasses which are adapted for use in accordance with this invention.

TABLE I

| Solder Glass or Ceramic Type | Coefficient of Thermal Expansion, in/in/°C. |
|---|---|
| Ferro Corp.[1] No. RN-3066-H | $167 \times 10^{-7}$ |
| Ferro Corp.[1] No. RN-3066-S | $160 \times 10^{-7}$ |
| Owens Illinois[2] No. EJ3 | $160 \times 10^{-7}$ |
| Owens Illinois[2] No. CV432 | $127 \times 10^{-7}$ |

[1] Proprietary composition manufactured by Ferro Corporation, Cleveland, Ohio.
[2] Proprietary composition manufactured by Owens Illinois Corporation, Toldeo, Ohio.

A preferred solder glass which has been adapted for use in accordance with this invention is a lead borate, lead-zinc borate, lead borosilicate or a lead zinc borosilicate including a substantially insoluble filler, such as calcium flouride to increase the effective coefficient of thermal expansion of the glass. In addition, this glass may be constituted of a copper oxide to enhance the bonding to the substrate components to which it is applied. Details of this glass are disclosed in U.S. patent application Ser. No. 651,984 entitled "Low Temperature Sealing Glass" filed Sept. 19, 1984 and U.S. patent application Ser. No. 651,987 entitled "Low Temperature Sealing Glass" filed Sept. 19, 1984. Additional details of the glass to metal seal are disclosed in U.S. patent application Ser. No. 651,986 entitled "Leadframe Alloy for Glass Sealed Package" filed Sept. 19, 1984 now abandoned.

Figure 3:
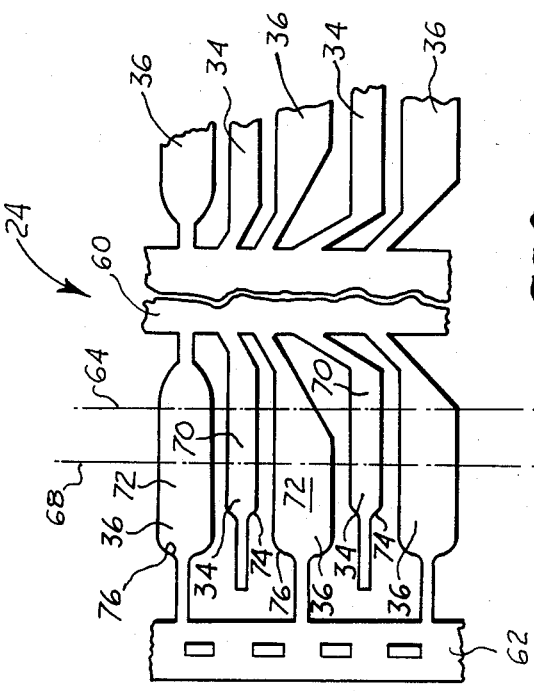
FIG. 3 is a partial view of a lead frame in accordance with the present invention.

Referring to FIG. 3, there is illustrated a section of the lead frame 24 prior to its assembly into the casing 10. The lead frame has an internal tie bar 60 which is connected to the tips of the leads 34 and 36. The internal tie bar 60 is an important feature of the lead frame and is required for its manufacture for the reasons described hereinbelow. A carrier strip 62 is connected to the outer ends of leads 36 for convenient handling of a continuous strip of lead frame material which has been fabricated into a series of lead frame configurations during the assembly and sealing operation for the package. The leads 34 of row 26 are preferably bent about an axis 64 to an angle of approximately 90° with respect to the axis 66 extending in the plane of the remaining unbent portion of the lead frame. The second row of leads 36 are preferably bent about an axis 68 so that the ends 28 of the leads 36 also extend in a transverse plane to the axis 66 through the plane of the lead frame. Each of the leads 34 and 36 are preferably relatively narrow at their outer ends closer so that they may be easily inserted into holes disposed in the printed circuit PC board to which the semiconductor casing is conventionally attached. The wider portions 70, 72 and the shoulders 74, 76 on the leads 34 and 36 respectively, act as stops to prevent the leads do not go further into the holes within the PC board than desired. Widening the leads has the additional advantage of strengthening them.

The lead frame may consist of a metallic material which has the ability to form a continuous refractory oxide layer on its surface. For example, the types of metals and metal alloys described hereinabove would be suitable. A more preferred metal or metal alloy is described in U.S. Pat. No. 4,434,016 to Saleh et al. and consists essentially of from about 10% to about 15% nickel, from about 1% to about 3% aluminum, up to about 1% manganese, from about 0.5% to less than about 0.5% magnesium and the balance copper. This alloy is of particular interest because it maintains its strength in the temperature range at which glass sealing usually occurs, i.e., below about 450° C. It is an important quality for the lead frame to maintain its strength when subjected to relatively high sealing temperatures so that it will not be easily bent during handling.

The sequence of assembly of the package shown in FIG. 1 is somewhat different from a typical Dual-In-Line package. In the typical Dual-In-Line package, the individual leads in the lead frame are held together by an external tie bar, ie. the carrier strip, which is removed in a lead trimming operation after the assembly has been completed. This means of keeping the lead frame together can only be used on the outer rows 28 of the leads in the package of the present invention. The inner rows 26 of leads must be held together by an internal tie bar, such as tie bar 60 as shown in FIG. 3. Before removing the inner tie bar 60, it is preferable to first glass bond the lead frame with the tie bar in place to the seal ring member 38. This causes the glass to position and secure the individual leads in place. Next, by means of a conventional piercing operation, the inner tie bar 60 is removed. During this assembly step, the punch or die used to pierce and cut the lead frame away from the lead tips need not contact the seal ring.

It is important to note that the actual bending of the lead frame about the axes of bending 64 and 68 occurs prior to the glass sealing of the lead frame to the seal ring. This is necessary in order to avoid imposing the bending stresses, which are unavoidable during the bending operation, upon the glass seal. After the seal ring has been bonded to the lead frame, the internal leads are inserted through the holes 18 disposed about the periphery of the base. The base is then glass sealed to the seal ring and lead frame assembly with a glass or ceramic component 42 in any conventional manner.

The semiconductor chip 12 may now be bonded to the surface 44 of base 16. The bonding step may be accomplished with a conductive plastic adhesive as is often the case in integrated circuits or with a relatively low melting temperature solder. Typically, the plastic adhesives include epoxies and polyimides. They may be formulated with powdered metals, such as silver, to improve their thermal conductivity and/or to provide a moderate electrical conductivity. The metal joining materials may include a gold-tin or lead-tin eutectic solder. In addition, it is within the scope of the present invention to use any desired solder or other bonding technique as required.

The interconnection between the chip 12 and the lead frame 24 is typically by small diameter lead wires 74 (usually gold) which are metallurgically bonded to the tips of the leads and to the chip. The bonding technique is preferably either thermosonic or thermocompression bonding. Thermosonic bonding is a combination of mechanically induced metallurgical bonding at temperatures above ambient in conjunction with the addition of ultrasonic energy. Thermocompression bonding is mechanical deformation at elevated temperature without the addition of the ultrasonic energy. A foil "spider" is often used as an alternative to the wires. The foil itself may be bonded to the chip by either thermosonic or thermocompression bonding. These relatively rapid techniques of bonding are advantageously substituted for the slower ultrasonic bonding required for aluminum wires used in the conventional glass sealed hermetic packages.

The high temperature sealing operation may conveniently be concluded before the semiconductor chip is mounted to the base member 16. By eliminating the need of subjecting the package to relatively high glass sealing temperatures, the chip may be attached to the base member with a relatively low melting temperature solder or even an organic adhesive. In either case, the problems associated with the mismatch in thermoconductivity between the chip and the base member are minimized. This is because the temperature difference between the chip bonding temperature and the ambient temperature is substantially less than in the case of gold-silicon eutectic braze bonding as is often required in conventional hermetically sealed semiconductor casing. In addition, the wires 74 between the lead frame and the chip may be thermocompression or thermosonically bonded. The slower ultrasonic wire bonding operation used in glass sealed hermetic packages can now be eliminated since the final enclosure uses relatively low temperature solder which does not adversely effect on the bonding wires. Finally, the cover member 40 is sealed to the seal ring assembly 38 to hermetically seal the semiconductor in the enclosure 14. This may be accomplished by a seal component 54 consisting of solder or glass as required. If a solder is used, the surfaces 50 and 52 to be soldered are preferably formed of a readily solderable copper alloy which permits the use of relatively inexpensive solders and eliminates the need to gold plate the soldered components. The solderable metals, as described above, are characteristically substantially less costly than the low expansively alloys which are frequently used in the present technology. If a glass is used, it is preferably the same type as glass 42 used to seal the lead frame between the base member and the seal ring. The surfaces 50 and 52 of the seal ring 38 and the cover 40, respectively would be coated with a refractory oxide coating as described above. Again, the metal or alloy of which the cover and seal ring is fabricated would necessarily be a material upon which the refractory oxide could be formed. Alternatively, a cladding could be constructed from at least one layer of a material upon which the refractory oxide layer could be formed and the other layer of a high conductivity material. Although the seal components 42 and 54 have been preferably specified as a glass or ceramic and a solder, respectively, it is also within the terms of the present invention to substitute an adhesive, such as an epoxy resin for either or both of the components 42 and 54.

Figure 2:
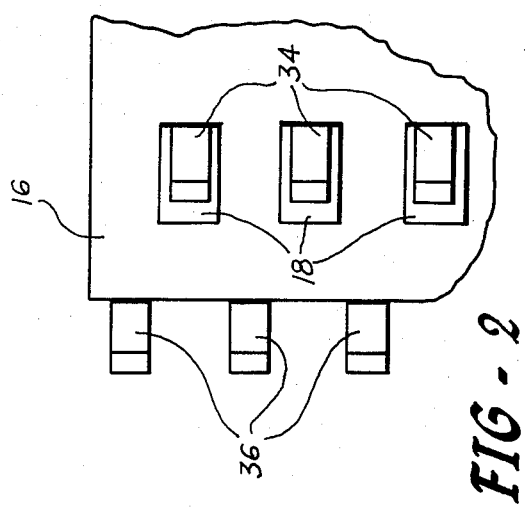
FIG. 2 is a partial bottom view taken along line 2—2 of FIG. 1.

Referring to FIG. 4, there is shown a second embodiment of the present invention directed to small outline integrated circuit packages (SOIC) which are a type of miniturized surface mounted Dual-In-Line packages. Since these packages are surface mounted, through-holes in the printed circuit board are not required. Therefore the leads are generally spaced on 0.05 inch centers instead of the 0.010 inch centers typical of the standard DIP packges which plug into the through-holes in the PC boards. For surface mounting, leads are generally formed into a gull wing configuration as illustrated in FIG. 4. The double row metal SOIC package 80 illustrated in FIG. 4 is similar to the QUIP package 10 of FIG. 1. The arrangement of FIG. 4 includes a base member 82 having a plurality of openings 84 disposed near its outer peripheral edges in the same manner as the openings 18 are disposed in the base member 16, as illustrated in FIGS. 1 and 2. The openings 84 must be large enough to receive the gull wing shaped leads of lead frame 86 without their coming into contact with the base member and thereby causing an electrical short circuit. The lead frame 86 has a surface 88 disposed in opposing relationship to surface 90 of the base member 82. The lead frame 16 is similar to the configuration shown in FIG. 3 prior to its mounting in casing 80. However, the specific shape of the individual leads may be changed in accordance with the particular application. The lead frame has at least two rows of leads 92 and 94 extending from opposite sides of the package. The first and second rows of leads each contain a plurality of lead pins 96 and 98 respectively. The individual pins of each row are disposed between the pins of the other row in a staggered relationship to each other. Each of the lead pins 96 extend through one of the plurality of openings 84 in the base member and are bent in the gull wing configuration so that the outer facing surface 100 is substantially in the same plane as the outer surface 102 of the base member 82. Each of the lead pins 98 extend between the base member and a seal ring member 104 external to the package 80. The end of the lead pin 98 is also bent into a gull wing configuration. The external surface 106 of the lead pin 98 is preferably in substantially the same plane as the outer surface 102 of member 82.

Seal ring member 104 has a surface 107 which is disposed in opposing relationship to a surface 108 of the lead frame 86. As in the case of the Quad-In-Line type package of FIG. 1, it is necessary to first seal the lead frame 86, while its internal tie bar is still attached, to the seal ring 104. Prior to this step, the lead pins 96 and 98, have been bent into their desired configuration. Once the lead frame is sealed to the seal ring, the interal tie bar (similar to the bar 60), which has been supporting both the first and second row of lead pins 96 and 98, is removed by any conventional means as described hereinabove with respect to tie bar 60. Then the base member 82 can be sealed to the lead frame and seal ring assembly. The sealing components 110 and 112 between the base member and the lead frame and between the lead frame and the seal ring, respectively, are preferably selected from a sealing glass or ceramic, such as a complex lead-borate glass with a filler as described hereinabove. This type of sealing material would be effective for hermetically sealing the package. However, it is also within the terms of the present invention to use any sealing adhesive such as an epoxy or other desired materials as described hereinabove with regard to the embodiment illustrated in FIG. 1.

In the SOIC package of FIG. 4, the second row of lead pins 98 project beyond the area covered by the package itself and are susceptible to bending. Bending of the leads can interfere with satisfactory soldering attachment of the leads to the surface of a printed circuit boards. It can be appreciated from FIG. 4, that the inner row of leads 96 are protected by being mounted within the openings 84 of the base 82. To protect pins 98, the seal ring may have a configuration wherein its end portions 114 extend beyond the package to cover the lead pins 98. The preferred embodiment would have the end portion 114 curved downward toward the lead pins to minimize the required amount of sealing material 112. It is also within the terms of the present invention to allow the seal ring to be a flat plate without any significant curves or bends in its surface. Then, ring 104 would preferably extend just over either a portion or the entire length to which the lead pins extend from the package.

Once the seal ring and lead frame assembly have been sealed onto the base member, a semiconductor die 120 is preferably bonded to the base member 82 in any conventional means as described hereinabove with regard to the bonding of die 12 in the embodiment of FIG. 1. Next, the lead wires 122 are bonded between the lead frame and the semiconductor chip as described hereinabove. Finally, a cover member 124 is sealed to the seal ring 114 by a seal component 126 corresponding to seal component 54 as described above with regard to the embodiment of FIG. 1. The metal and metal alloys used to fabricate the base member, the lead frame, the seal ring and the cover are of the type described hereinabove in relation to the QUIP package of FIG. 1. The package 80 of FIG. 4 may be either hermetically sealed or nonhermetically sealed depending upon the particular application.

A lead chip carrier is simply a four sided version of a SOIC type in-line surface mounted package as shown in FIG. 4. The leads can project beyond the edge of the package in a gull wing configuration as in the case of an SOIC. In the case of plastic packaged leaded chip carriers, the leads are frequently bent back underneath the package after the package has been molded. Then, the points of electrical contact with the printed circuit board are actually within the periphery of the outer edges of the package. Under these circumstances, the leads are said to be formed in a "J" configuration. The leads are actually supported by the bottom of the plastic package against which they had been formed and they are effectively protected from bending or other possible damage. In the case of glass sealed hermetic chip carriers, forming the leads back under the package is not very practical because of the substantial stresses on the glass seal by the lead frame forming step subsequent to glass sealing has already been completed.

FIG. 5 shows a section of a package 130 similar to the embodiments shown in FIG. 4, but preferably directed to a leaded chip carrier where the leads are within the periphery of the outside edges of the package. The base member 132 has a plurality of openings 134 in line with the edges of the package as can be seen in FIG. 7 (a bottom view of FIG. 5). In addition, a plurality of slots 136 are disposed about the edge of the base 132 and afford protection for the gull wing lead pins. The base member 132 is formed of a metal or meetal alloy as described in the embodiment of FIG. 1 and therefore can be formed with the required holes and slots by any conventional technique such as punching and milling.

The metal or metal alloy lead frame 138 is formed with two rows 140 and 142 of interdispersed, staggered lead pins 147 and 144 respectively. The direction of the gull wing on the inner row 140 of leads 146 is reversed as compared to the embodiment of FIG. 4. The configuration of the lead pin 146 required to reverse the inner lead inward toward the package can be better understood by referring to FIG. 6. There, a portion of a lead frame is illustrated with the lead tips 148 and 150 being connected to an internal die bar 152. The inner lead pins 146 extend outward to approximately the outer edge of the package 130. A portion 154 of the lead pin 146 is sheared away from portion 156 of the lead pin and is formed downwards into a gull wing configuration as best seen in FIG. 5. As with the configuration of FIG. 4, the bottom surface 158 and 160 of the lead pins 144 and 154 respectively are substantially in the same plane as the bottom surface 162 of the base member 132. The sealing component 164, the metal or metal alloy seal ring 165, the seal component 168 and the metal or metal alloy cover 166 are substantially the same as described in regard to the corresponding components of the embodiment illustrated in FIG. 4. Further, the sequence of construction of a chip carrier package using the details of the embodiment illustrated in FIGS. 5 through 7 is substantially the same as explained with regard to the construction of the embodiment illustrated in FIG. 4.

Referring to FIG. 8, there is illustrated a cross-section of a pin grid array 170. It is contructed from a metal or metal alloy base member 172, a metal or metal alloy lead frame 174 having lead pins 176, a metal or metal alloy seal ring 178 and a metal or metal alloy cover 180. A conventional pin grid array package is used to achieve greater lead density in a through-hole package. It accomplishes this by first changing from a Dual-In-Line configuration to a four sided configuration and by using two or more spaced rows of leads. Although the embodiment shown in FIG. 8 is shown with three rows of leads, it is in the terms of the present invention to use any number of rows as desired.

Pin grid array packages which, as presently used in the electronic industry, are inherently quite expensive. They are typically formed by taking a ceramic base and forming a circuit on one surface of the base using metallization techniques. The metallization is usually provided by a thick film of gold. Then, each individual pin is brazed in place to the gold metallization with a gold base brazing material. Frequently, the pins themselves are also gold plated. Needless to say this large amount of gold and the individual brazing of each pin is a tedious and expensive proposition.

The embodiment of FIG. 8 provides an alternative construction for pin grid array packages. The lead frame 174 is similar to lead frame 24 illustrated in FIG. 3 in that it preferably has an internal tie bar (not shown) connected to the inner ends of the leads and a carrier strip connected to the outer ends of the leads. The lead frame 174 may be of any desired configuration. Lead frame 174 is sealed by a glass or ceramic sealing component 182 to the seal ring component 178. The glass may be constituted as described with regard to sealing component 42. The lead pins 176 of the lead frame are spaced from each other and preferably bent into the desired configuration prior to the sealing of the lead frame 174 to the seal ring 178. The carrier strip, if provided, may be removed prior to or subsequent to the bending step in accordance with the specific lead frame configurations. A plurality of openings 184 are provided in the seal ring to accomodate each of the lead pins in order that they may extend external to the package without being in physical contact with the metallic seal ring 178. Once the lead frame is securely sealed to the seal ring, an internal tie bar (not shown) similar to the tie bar 60, described in the first embodiment and illustrated in FIG. 3, is removed. Then the seal ring and lead frame assembly is bonded to the base member 172 using a glass or ceramic sealing component 186 which is preferably similar to the glass sealing component 182. Next, the chip 188 is bonded on to the base member 172 and attached to the tips of the lead pins by wires 190. Finally, the cover 180 is sealed to the top surface 192 of the seal ring 178 by any desired sealing means 194 such as a solder or glass as described in connection with the corresponding seal component 54 of embodiment illustrated in FIG. 1. The metal or metal alloys used for each component as well as the sealing materials are substantially the same as those described hereinabove in connection with the corresponding components of the embodiment illustrated in FIG. 1.

The patents and patent applications set forth in this application are intended to be incorporated by reference herein.

It is apparent that there has been provided in accordance with this invention a high density package which satisfies the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A high density package forming an enclosure for receiving an electronic device, comprising:
    a metal or metal alloy base member, said base member having a plurality of openings extending therethrough being disposed adjacent at least two opposing sides thereof;
    a metal or metal alloy lead frame having a first surface disposed adjacent said base member, said lead frame having first and second rows of leads extending from at least two opposing sides thereof, each of said first and second rows including a plurality of leads;
    a metal or metal alloy seal ring member disposed adjacent a second surface of said lead frame;
    said lead frame being disposed so that each of said plurality of leads in said first row extends through one of said plurality of openings in said base member external to said package and each of said plurality of leads in said second row extends between said base member and said seal ring member external to said package;
    a metal or metal alloy cover member disposed adjacent said seal ring member; and
    means for sealing said enclosure, the seal means disposed between said base member and said lead frame, between said lead frame and said seal ring member and between said seal ring member and said cover member.

2. The package of claim 1 wherein the leads of said first and second rows are disposed in a staggered relationship to each other.

3. The package of claim 2 wherein an axis through the plane of said second row of leads extends transversely to an axis through the plane of said first row of leads.

4. The package of claim 3 wherein said plurality of leds in said first row are shorter than the plurality of leads in said second row.

5. The package of claim 4 wherein said metal or metal alloy is a copper alloy comprising an effective amount of up to about 12% aluminum to form a refractory oxide and the balance essentially copper.

6. The package of claim 5 wherein said copper alloy consists essentially of 2.5 to 3.1% aluminum, 1.5 to 2.1% silicon and the balance essentially copper.

7. The package of claim 5 wherein said means for sealing comprises a glass or ceramic component.

8. The package of claim 5 wherein said means for sealing comprises an adhesive.

9. The package of claim 5 wherein the sealing means comprises:
    a glass or ceramic component between said base member and said lead frame and between said lead frame and said seal ring member; and
    a solder component between said seal ring member and said cover member.

10. The process of forming a high density package enclosing an electronic device, comprising the steps of:
    providing a metal or metal alloy base member, said base member having a plurality of openings extending therethrough and disposed adjacent at least two opposite sides thereof;
    providing a metal or metal lead frame having first and second rows of leads extending from at least two opposing sides thereof, each of said first and second rows including a plurality of leads;
    providing a metal or metal alloy seal ring member;
    providing a metal or metal alloy cover member;
    bending said plurality of leads of said first row so as to extend transversely to an axis through the plane of said lead frame member;
    sealing said lead frame to said seal ring member;
    disposing the sealed lead frame and seal ring member adjacent said base member so that each of said plurality of leads on said first row extends through one of said plurality of openings in said base member;
    sealing said lead frame and said base member;
    affixing the electronic device to said base member; and
    sealing said cover member to said seal ring member.

11. The process of claim 10 further comprising the steps of:
providing a tie bar connecting said first and second rows of leads; and
removing said tie bar subsequent to the step of sealing said lead frame to said seal ring member.

12. The process of claim 11 further comprising the steps of:
providing a carrier strip connecting the ends of the second row of leads; and
removing said carrier strip subsequent to the step of sealing said lead frame to said seal ring member.

13. The process of claim 11 including the step of selecting said metal or metal alloy from a copper or copper base alloy.

14. The process of claim 13 including the step of selecting said copper base alloy comprising an effective amount of up to about 12% aluminum to form a refractory oxide and the balance essentially copper.

15. The process of claim 14 wherein the step of sealing said lead frame to said seal ring member and said base member to said lead frame includes providing a glass or ceramic for the sealing material.

16. The process of claim 15 wherein the step of sealing said cover member to said lead frame member includes providing a solder as the sealing material.

17. The process of claim 14 wherein the step of sealing includes providing an adhesive as a sealing material.

18. A high density package forming an enclosure for receiving electronic device, comprising:
a metal or metal alloy base member, said base member having a plurality of openings extending therethrough and disposed adjacent at least two opposing sides thereof; said base member further having a plurality of slots extending from the edges of said least two opposite sides thereof;
a metal or metal alloy lead frame having a first surface disposed adjacent said base member, said lead frame having first and second rows of leads extending from at least two opposing sides thereof, each of said first and second rows including a plurality of leads;
a metal or metal alloy seal ring member disposed adjacent a second surface of said lead frame;
said lead frame disposed so that each of said plurality of leads in said first row extends through one of said plurality of openings in said base member external to said package and each of said plurality of leads in said second row extending through one of said plurality of slots in said base member;
a metal or metal alloy cover member disposed adjacent said seal ring member; and
means for sealing said enclosure, the seal means disposed between said base member and said lead frame, said lead frame and said seal ring member and between said seal ring membr and said cover member.

19. The package of claim 18 wherein the leads of said first and second rows are disposed in a staggered relationship to each other.

20. The package of claim 19 wherein the plurality of leads in said first row are bent into a gull wing configuration wherein one surface of each of said leads on said first row is substantially in the same plane as an outer surface of said base member.

21. The package of claim 20 wherein the plurality of leads in said second row are bent into a gull wing configuration wherein one surface of each of said leads in said second row is substantially in the same plane as an outer surface of said base member.

22. The package of claim 21 wherein said metal or metal alloy is a copper alloy comprising an effective amount of up to about 12% aluminum to form a refractory oxide and the balance essentially copper.

23. The package of claim 22 wherein said means for sealing comprises a glass or ceramic component.

24. The package of claim 22 wherein said means for sealing comprises an adhesive.

25. The package of claim 22 wherein the sealing means comprises:
a glass or ceramic component between said base member and said lead frame and between said lead frame and said ring member; and
a solder component between said ring member and said cover member.

26. The process of forming a high density package enclosing an electronic device, comprising the steps of:
providing a metal or metal alloy base member, said base member having a plurality of openings extending therethrough and disposed adjacent at least two opposite sides thereof;
said base member further having a plurality of slots extending from the edges of said at least two opposite sides thereof;
providing a metal or metal lead frame having first and second rows of leads extending from at least two opposing sides thereof, each of said first and second rows including a plurality of leads;
providing a metal or metal alloy seal ring member;
providing a metal or metal alloy cover member;
bending said plurality of leads in said first and second rows so as to extend transversely to an axis extending through the plane of said lead frame member;
sealing said lead frame and said base member;
disposing the sealed lead frame and seal ring member adjacent said base member with each of said plurality of leads on said fist row extending through one of said plurality of openings in said base member and each of said plurality of leads in said second row extending through one of said plurality of slots in said base member;
sealing said lead frame to said seal ring member;
affixing the electronic device to said base member; and
sealing said cover member to said seal ring member.

27. The process of claim 26 further comprising the steps of:
providing a tie bar connecting said first and second rows of leads; and
removing said tie bar subsequent to the step of sealing said lead frame to said seal ring member.

28. The process of claim 27 further comprising the steps of:
providing a carrier strip connecting the ends of the second row of leads; and
removing said carrier strip subsequent to the step of sealing said lead frame to said seal ring member.

29. The process of claim 27 including the step of selecting said metal or metal alloy from a copper or copper base alloy.

30. The process of claim 29 including the step of selecting said copper base alloy comprising an effective amount of up to about 12% aluminum to form a refractory oxide and the balance essentially copper.

31. The process of claim 30 wherein the step of sealing said lead frame to said seal ring member and said base member to said lead frame includes providing a glass or ceramic for the sealing material.

32. The process of claim 31 wherein the step of sealing said cover member to said lead frame member includes providing a solder as the sealing material.

33. The process of claim 31 wherein the step of sealing includes providing an adhesive as a sealing material.

34. The process of claim 26 including the step of bending the plurality of leads in said first row into a gull wing configuration wherein one surface of each of said leads in said first row is substantially in the same plane as an outer surface of said base member.

35. The process of claim 34 including the step of bending the plurality of leads in said second row into a gull wing configuration wherein one surface of each of said leads in said second row is substantially in the same place as an outer surface of said base member.

36. A high density package forming an enclosure adapted to receive an electronic device, comprising:
a metal or metal alloy base member;
a metal or metal alloy lead frame having a first surface disposed adjacent said base member, said lead frame comprised of a plurality of leads of varying lengths, each of said leads being bent at one end transverse to a plane through said lead frame;
a metal or metal alloy seal ring member disposed adjacent a second surface of said lead frame, said seal ring member having a plurality of openings extending therethrough, each adapted to receive one of the bent ends of said plurality of leads;
metal or metal alloy cover member disposed adjacent said ring member; and
means for sealing said enclosure, the seal means being disposed between said base member and said lead frame, between said lead frame and said ring member and between said seal ring member and said cover member.

37. The package of claim 36 wherein said metal or metal alloy is a copper alloy comprising an effective amount of up to about 12% aluminum to form a refractory oxide and the balance essentially copper.

38. The package of claim 37 wherein said means for sealing comprises a glass or ceramic component.

39. The package of claim 37 wherein said means for sealing comprises an adhesive.

40. The package of claim 37 wherein the sealing means comprises:
a glass or ceramic component between said base member and said lead frame and between said lead frame and said ring member; and
a solder component between said ring member and said cover member.

41. The proces of forming a high density package receiving an electronic device, comprising the steps of:
providing a metal or metal alloy base member;
providing a metal or metal alloy lead frame having a plurality of leads of varying lengths, one end of each of said leads being bent transverse to the plane through said lead frame;
providing a seal ring member having a plurality of openings extending therethrough;
providing a metal or metal alloy cover member;
positioning each of said bent leads through one of the openings on said seal ring member;
sealing said lead frame to said seal ring member;
sealing said lead frame to said base member;
affixing the electronic device to said base member; and
sealing said cover member to said seal ring member.

42. The process of claim 41 further comprising the steps of:
providing a tie bar connecting the inner ends of said plurality of leads; and
removing said tie bar subsequent to the step of sealing said lead frame to said seal ring member.

43. The process of claim 41 including the step of selecting said metal or metal alloy from a copper or copper base alloy.

44. The process of claim 43 including the step of selecting said copper base alloy comprising an effective amount of up to about 12% aluminum to form a refractory oxide and the balance essentially copper.

45. The process of claim 44 wherein the step of sealing said lead frame to said seal ring member and said base member to said lead frame includes providing a glass or ceramic for the sealing material.

46. The process of claim 45 wherein the step of sealing said cover member to said lead frame member includes providing a solder as the sealing material.

47. The process of claim 44 wherein the step of sealing includes providing an adhesive as a sealing material.

* * * * *